United States Patent
Muller et al.

(10) Patent No.: US 7,049,577 B2
(45) Date of Patent: May 23, 2006

(54) SEMICONDUCTOR HANDLER INTERFACE AUTO ALIGNMENT

(75) Inventors: Luis A. Muller, Lexington, MA (US); John D. Moore, Deerfield, NH (US); Erik C Svendsen, Melrose, MA (US)

(73) Assignee: Teradyne, Inc., Boston, MA (US)

( * ) Notice: Subject to any disclaimer, the term of this patent is extended or adjusted under 35 U.S.C. 154(b) by 207 days.

(21) Appl. No.: 10/261,005

(22) Filed: Sep. 30, 2002

(65) Prior Publication Data

US 2004/0062104 A1    Apr. 1, 2004

(51) Int. Cl.
*H01J 40/14* (2006.01)
(52) U.S. Cl. ........................ 250/221; 250/548
(58) Field of Classification Search ............... 250/221, 250/223 R, 223 B, 239, 216, 559.4, 559.3, 250/548; 324/158.1, 765, 753, 758
See application file for complete search history.

(56) References Cited

U.S. PATENT DOCUMENTS 4,962,318 A * 10/1990 Nishi .................... 250/548
5,739,525 A *  4/1998 Greve .................. 250/227.11

* cited by examiner

*Primary Examiner*—Que T. Le

(57) ABSTRACT

A test cell for use in a semiconductor manufacturing operation allowing alignment of semiconductor devices to be tested to a test station. The test cell is well suited for testing semiconductor devices on carrier strips. To aid in alignment, the test cell includes a down-ward looking camera and a simple upward looking sensor. Fiducials are acurately positioned relative to the test site, which are easily detected by the simple sensor. A controller within the test cell uses the output of the camera and the sensor, in conjunction with position sensors on a robotic assembly, to determine relative positions of the devices to be tested and the test station and issue the appropriate commands to align the devices to the test station.

16 Claims, 7 Drawing Sheets

SEMICONDUCTOR HANDLER INTERFACE AUTO ALIGNMENT

This invention relates generally to the manufacture of semiconductors and more specifically to aligning semiconductors to be tested with a test site.

In the manufacture of semiconductors, the parts are usually tested at least once during the manufacturing operation. Based on the results of the tests, some parts might be discarded as defective. Others might be assigned performance grades, indicating that the device is not fully functioning but operates at a reduced performance grade. For example, a memory chip designed for 128 megabits might be tested and found to operate on only 64 megabits. Such a part might be packaged for operation at a reduced performance. Similarly, a chip designed to operate at 1 GHz might be found to operate properly only at speeds up to 866 MHz. Such a part might be classified for operation at 866 MHz. In this way, even chips that are not fully functioning can still be sold.

The required tests are run with Automatic Test Equipment (ATE), such as is sold by Teradyne, Inc of Boston, Mass. The ATE contains electronic circuitry that generates test signals and measures the responses of the chips being tested.

In some instances, chips are tested while still on a wafer. Other times, chips are tested after they have been packaged. To test chips on a wafer, a device called a prober brings a wafer to a test site. The test site includes many probes that are positioned in a pattern that match a pattern of test points on the chips on the wafer. The prober positions the wafer under the probes and presses the wafer into the test site so that the probes make contact with the test points.

Usually, there are enough probes at the test site that multiple chips can be tested at one time. However, there are more chips on the wafer than can be tested at one time. Thus, once one group of chips is probed, the prober moves the wafer to align another group of chips with the test site, and this group of chips is then tested.

A similar process occurs when testing chips that have already been packaged. The packaged parts contain leads that make electrical connection to the chip inside the package. To test parts already in packages, the test site includes contactors that can make electrical connection to the leads. A device called a handler brings the packaged parts to the test site, either singly or in groups, and presses them into the contactors.

The handler likewise presents the packaged parts in groups to the test station. In some instances, the packaged parts are held in trays or other carriers for presentation to the contactors. Other handlers can move strips of packaged parts. In either event, the handler might operate on larger groups of chips than can be tested at one time. In this case, once the test of one group of packaged parts is completed, the handler must re-align the tray or strip of parts with the test station so that a new group of parts can be tested.

Many variations of probers and handlers are known. One type includes a robotic assembly that moves groups of devices to be tested to the test station. The robot presses a group of parts into the test station and, when the test is complete, repositions itself to present a different group of devices to the test station.

For the testing to be accurate, the robot must be aligned with the test station. Various techniques for aligning the robot with the test station have been used. For most handler applications, there has been a high degree of human involvement in the alignment. Some handlers are mechanically aligned, such as by placing shims in the test robot until it is aligned with the test site. Other handlers can be "taught" an alignment. In the learning phase, a human moves the robot into alignment with the test site. The robot "learns" the aligned position and returns to that position before plunging. More sophisticated alignment techniques have been used on probers for positioning wafers relative to a test system. For example, some probers have included a camera on the test robot that can be focused on the test site and a camera on the test site that can be focused on the test robot. In this way, the relative positions of the test site and the device to be tested can be determined so that the prober can align specific parts on the wafer with the test probes before plunging. However, use of multiple cameras adds cost to the system. There is cost associated with the cameras and cost associated with retrieving and analyzing the signals from the camera, particularly a camera that is mounted on a moving robot.

It would be desirable to have a way to align a material handling system to a test system.

SUMMARY OF THE INVENTION

With the foregoing background in mind, it is an object of the invention to provide an improved way to align a material handling system to a test system.

The foregoing and other objects are achieved in a test cell that includes a camera positioned to image a robotic assembly used to move devices to be tested. The robotic assembly has a sensor that detects fiducials on the test site. The test cell is controlled to use the camera to determine the relative position of the test robot in a frame of reference. The sensor is used to determine the location of the test site in the same frame of reference, allowing the robotic assembly to be aligned with the test site.

In a preferred embodiment, the test cell tests semiconductor devices in a strip and the camera is also used to determine the orientation of the strip to the robotic stage.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
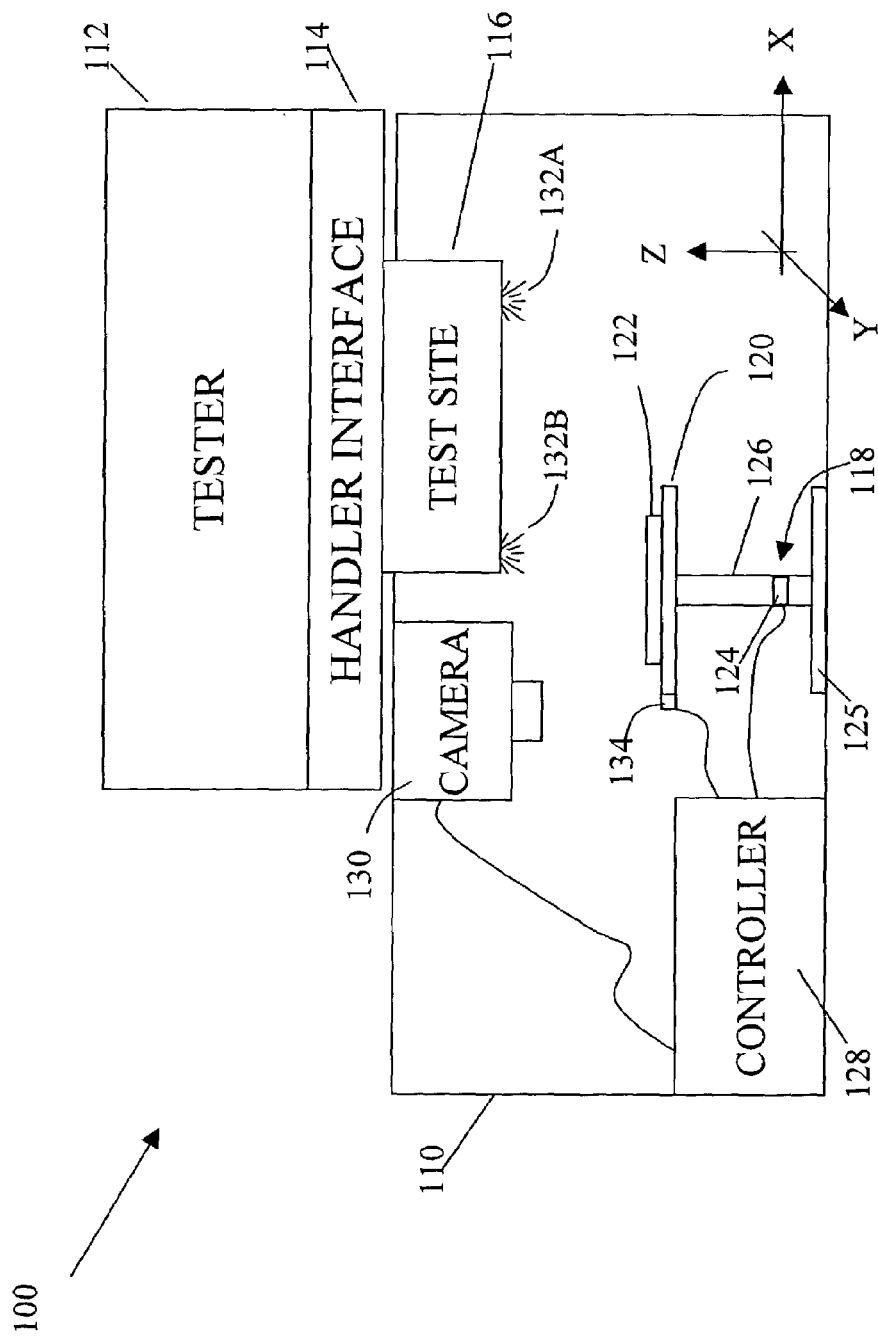
FIG. 1 is a block diagram of a test cell using the invention.

FIG. 1 shows a test cell 100 that includes a material handling unit and a tester. In the illustrated embodiment, the material handling unit will be described as a handler 110 for packaged semiconductor devices. In the preferred embodiment, handler 110 is a strip handler for moving packaged semiconductor devices that are joined on a carrier strip.

Test cell 100 also includes a tester 112. In the preferred embodiment, tester 112 is a J750 tester of the type sold by Teradyne, Inc. However, the type of tester is not important to the invention.

Test cell 100 includes a test site 116. In use, handler 110 moves devices to be tested to the test site 116 and presses them into electrical contacts (220, FIG. 2). Tester 112 is electrically connected to test site 116 through an interface, here shown as handier interface board 114. Such an interface is conventional, but the precise mechanism by which the tester is interfaced to the test site is not critical to the invention.

To move devices to test site 116, handler 110 includes some form of robotic assembly. Here a robotic assembly 118 is illustrated. Various types of robotic assemblies are known in the art. In the illustrated embodiment, robotic assembly 118 includes a platform 120 on which chip strip 122 is supported.

Platform 120 is moved by robotic assembly 118 to bring chip strip 122 in contact with test site 116 so that the chips on chip strip 122 can be tested. Preferably, platform 120 will move with multiple degrees of freedom so that individual chips in chip strip 122 can be aligned with contactors in test site 116. In the preferred embodiment, the robotic assembly 118 moves platform 120 in the directions labeled X, Y and Z and also rotates about the Z axis. Platform 120 is preferably constructed to be parallel to test site 116 so that motion with 4 degrees of freedom is adequate to fully align the chips with the contactors.

Various known techniques could be used to construct robotic assembly 118. In the illustrated embodiment, platform 120 is mounted on a post 126. Post 126 is in turn mounted to an X-Y stage 125. X-Y stage 125 includes linear rails (not shown) to provide motion in the X direction. Such a structure is preferred because it allows motion that can be constrained to just one direction. A separate, stacked, set of rails (not shown) provides motion in the Y direction. Post 126 may also rotate and telescopes, to provide motion in the Z direction. All of these motions are motor driven in response to control signals generated by controller 128. Controller 128 can be simply implemented as a software program written for a microprocessor or a general-purpose computer. In addition, feedback on the range of motion can be provided to controller 128 through sensor 124. Sensor 124 detects motion in at least the X direction. An example of a sensor that is suitable for this application is a linear encoder. Sensor 124 might also produce an output that indicates motion or position of robotic assembly or platform 120 in other directions.

Controller 128 executes control algorithms to position platform 120 in the desired locations. For example, in the course of testing chips, this might include moving platform to a location where a strip of chips is loaded onto it. Then, controller 128 would generate the signals to move the chips vertically below test station 116. Thereafter, controller 128 would generate signals to move the platform in the Z direction to "plunge" the chips into the test contactors. After testing, the chips would be withdrawn by moving them in the reverse direction along the Z axis. Further motion would take platform 122 to an unload station where the tested chips would be removed. Then, the process would be repeated.

However, to move chip strip 122 into alignment with test station 116, it is necessary for controller 128 to know the relative positions of chip strip 122 and test station 116. The relative positions of chip strip 122 and test station 116 is, in the preferred embodiment, determined by measuring the position of chip strip 122 relative to platform 122 and the position of the test station relative to platform 120.

In the preferred embodiment, camera 130 is used in determining relative positions. Camera 130 is preferably a digital imaging camera that allows for easy processing of the images it forms by controller 128. Digitial image processing is known in the art and digital image processing algorithms are commercially available for use in conjunction with cameras that form digital images. For example, suitable cameras and image processing algorithms are available from Cognex, Inc. of Natick, Mass.

To aid in determining the location of test station 116, test station 116 is equipped with fiducials 132A and 132B. Fiducials 132A and 132B are described in greater detail in connection with FIG. 2. However, simply stated, they are features on test station 116 that are easy to locate. They are also accurately positioned relative to other parts of test station 116 such that, once the fiducials are located, the locations of other parts of test station 116 can be determined.

To aid in detection of fiducials 132A and 132B, sensor 134 is mounted to platform 120. As platform 120 is moved by robotic assembly 118, sensor 134 can detect fiducials 132A and 132B. The algorithm used for determining positions are described in greater detail below.

Figure 2:
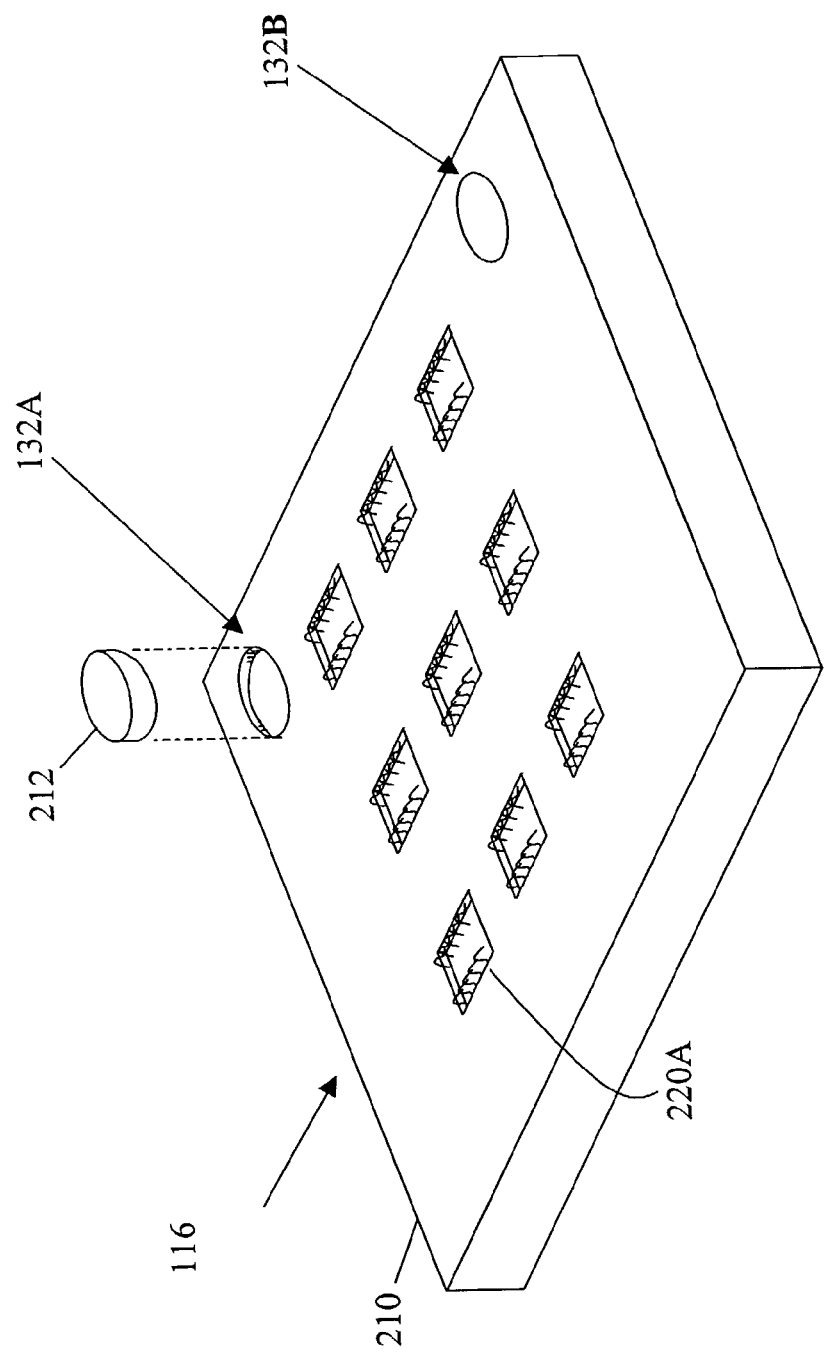
FIG. 2 is an illustration of contactors in test site incorporating fiducials.

Turning now to FIG. 2, test station 116 is shown in greater detail. Test station 116 includes a base member 210. Base member 210 could be a printed circuit board or could be a more rigid member, such as a metal plate. Base member 210 may be made of the same material as a convention handler interface board.

An array of contactors is formed on base member 210. In the illustration, nine contactors 220 are shown, with only contactor 220A being numbered for clarity. Contactors 220 can be contactors as are known in the art. They include numerous electrically conducting spring members that make contact with individual test points on the semiconductor devices being tested.

The precise number of contactors is not important to the invention. The contactors should, however, be arranged to line up with semiconductor devices when they are plunged for testing. When devices are tested as part of a strip of devices, contactors 220 should have the same spacing as devices on the strip.

Fiducials 132A and 132B are positioned on test station 116 relative to contactors 220. In the illustrated embodiment, fiducials 132A and 132B are formed from inserts 212 placed in base 210. Inserts 212 preferably have a round surface of a reflective material. While not required, this construction facilitates easy location of the fiducials. An example of a suitable material from which to construct the insert is a silica rod.

Figure 3:
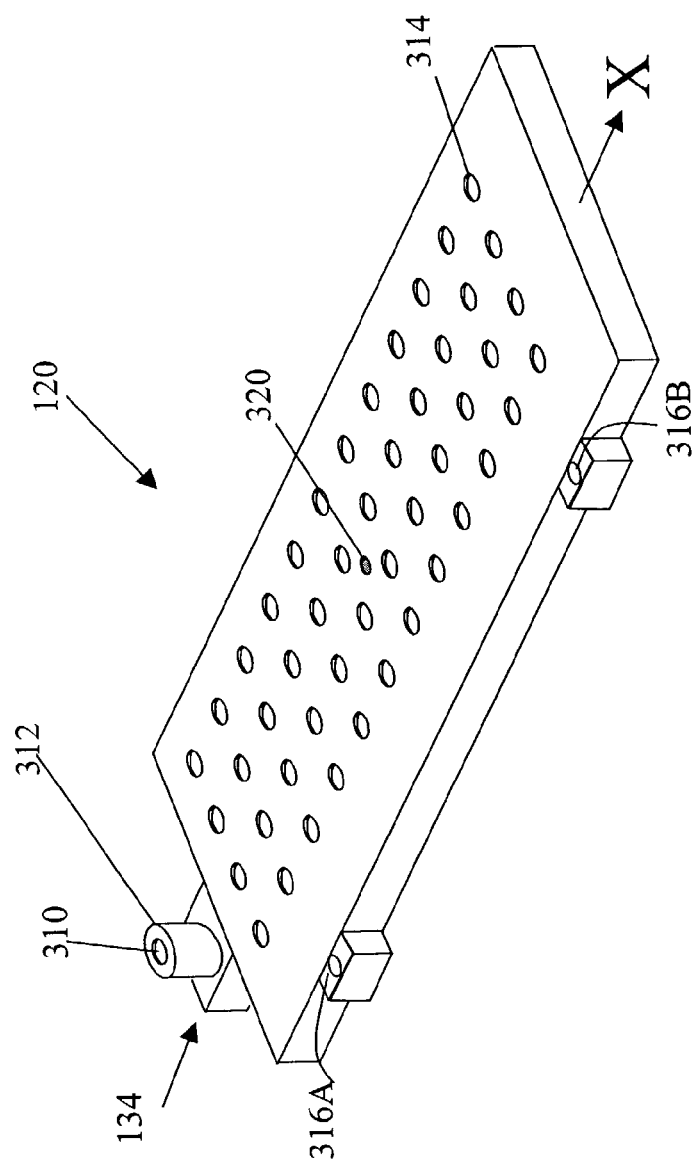
FIG. 3 is is an illustration of a platform of robotic assembly.

Turning now to FIG. 3, further details of platform 120 are shown. Sensor 134 is shown in greater detail. In the preferred embodiment, sensor 134 includes an optical fiber 310 that is connected to a light source (not shown), such as a laser or a laser diode. Optical fiber 310 provides two benefits. In addition to providing illumination for fiducials 132A and 132B, making them easier to detect, it makes sensor 134 readily detectable in an image formed by camera 130. Preferably, there will be an easy way to determine the center of the sensing zone around sensor 134. Having a bright spot created by the optical fiber 310 at the center of sensor 134 provides an easy way to accomplish this function.

Sensor 134 also includes a receptor 312 that is sensitive to light, preferably the light that is emitted through optical fiber 310. The output of sensor 134 is an electrical signal that indicates the intensity of the light incident on receptor 312. In a preferred embodiment, the output of receptor 312 is binary, having a high output when the incident light exceeds a threshold.

The threshold is set such that when sensor 134 is positioned under fiducials 132A or 132B, the light reflected back to receptor 312 will exceed the threshold. When sensor 134 is not under one of the fiducials, the incident light will be below the threshold.

Sensors performing the functions described above are known in the art. In the preferred embodiment, a commercially available component is used for sensor 134.

Sensor 134 is used in the process of locating fiducials 132A and 132B. Simply, platform 120 is moved until the output of sensor 134 becomes high. The X-Y location of sensor 134 at this time indicates the X-Y position of a point on the fiducial. This process is explained in greater detail below.

In the preferred embodiment, platform 120 has an upper surface with a plurality of vacuum holes 314 in it. Vacuum holes 314 are connected to a vacuum source (not shown) for drawing a vacuum. Holes 314 are preferably positioned to align with semiconductor devices to be placed on platform 120. In this way, the semiconductor devices to be tested are held to platform 120. Platform 120 could be similar to the plate described in pending patent application Ser. No. 09/585,453 entitled Semiconductor Handler for Rapid testing by Pfahnl et al., which is hereby incorporated by reference. However, other structures could also be used.

Platform 120 also includes reference points 316A and 316B. These reference points will be used to determine the orientation of platform 120. Reference points 316A and 316B are features that are visually distinguishable from the rest of platform 120 and can be readily detected in an image formed by camera 130.

Turning now to FIG. 4, the process of aligning the semiconductor chips to be tested with the contactors of test station 116 is shown. It will be appreciated that, in the preferred embodiment, the steps shown in FIG. 4 are performed by software programming of controller 128.

Figures 4A, 4B:
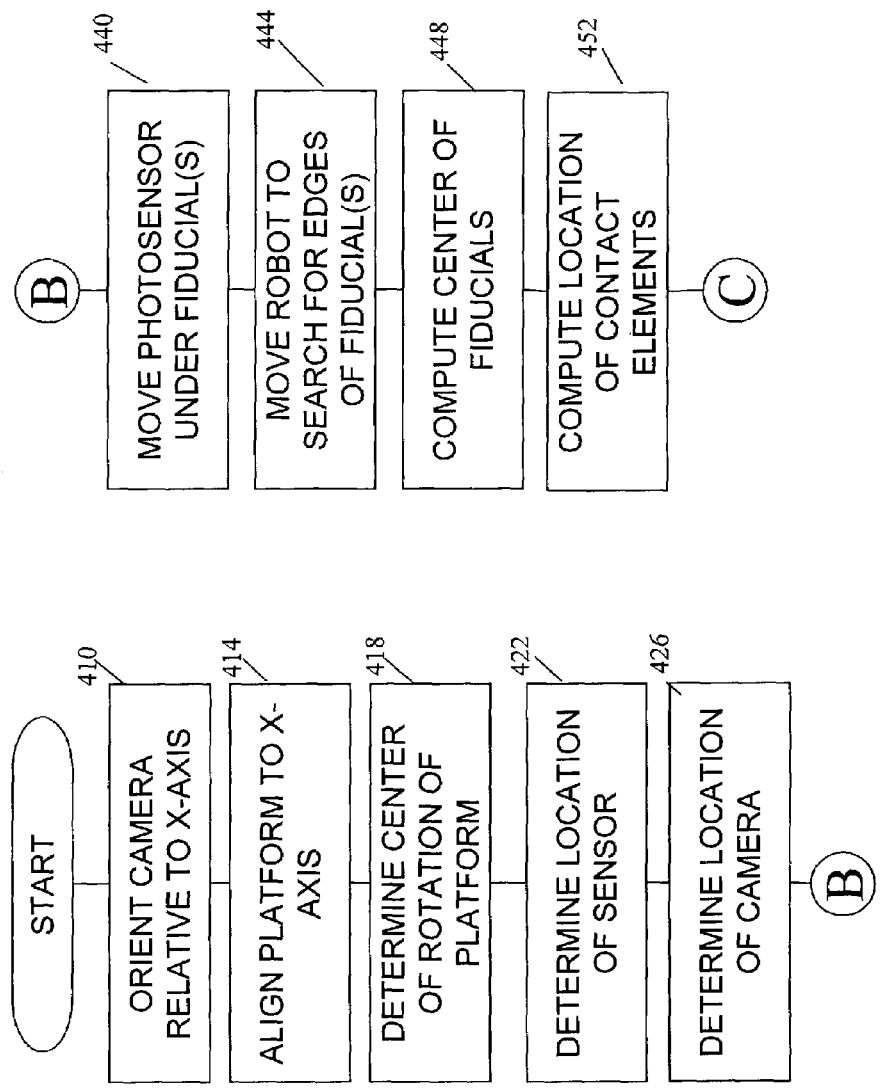
FIG. 4 is a flow chart illustrating a testing method that uses the invention.
Figure 4C:
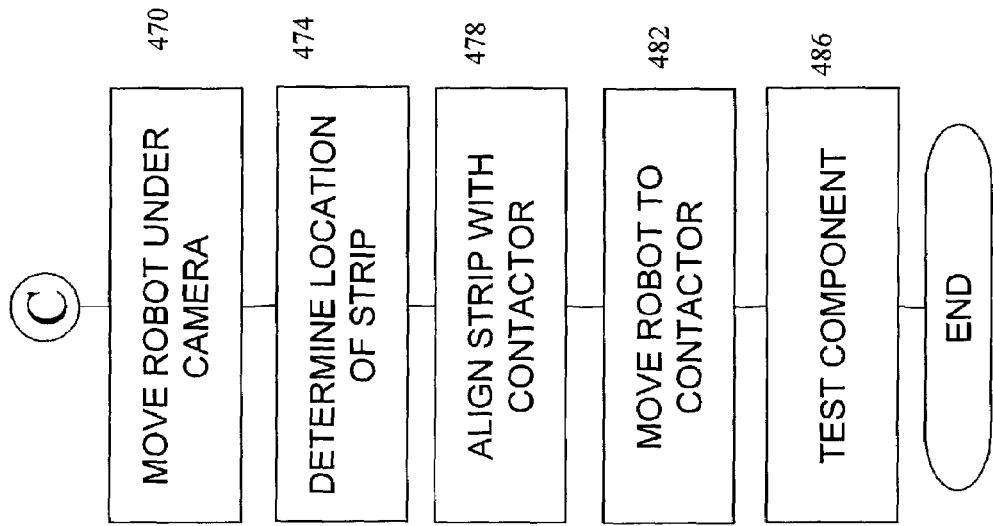

The alignment process is shown separated into three pieces, with one piece shown in each of FIGS. 4A, 4B and 4C. These processes can be run at different times and with different frequencies.

The process of FIG. 4A determines the location of camera 130. The location of camera 130 is fixed and camera alignment need not be repeated frequently. In a manufacturing operation, it is likely that this operation would be performed when handler 110 is first turned on each time it is used.

The process of FIG. 4B determines the location of the contactors. While the contactors ideally would not move, semiconductor devices are often heated or cooled for testing. Temperature changes can cause thermal expansion or contraction, which would have the effect of moving the contactors. Therefore, the contactor alignment process shown in FIG. 4B would likely be performed on a periodic basis as handler 110 is used to test parts. For example, it might be run every 20 minutes.

The process of FIG. 4C determines the location of a strip of semiconductor chips relative to platform 120. While physical alignment features can be used to position the semiconductors relative to platform 120, preferably, this process is run for each strip of semiconductors loaded onto platform 120.

Turning first to FIG. 4A, the first portion of the alignment sequence is described. At step 410, the orientation of camera 130 is determined relative to the X-axis. Camera 130 will create a planar image and points in the image could be described in terms of their positions along two perpendicular axes, $X_c$ and $Y_c$. In general, the orientation of these axes will be set by the orientation of the focal array in the camera.

Because camera 130 is looking down into the X-Y plane, it will create an image of the X-Y plane. However, the X axis of handler 110 is taken to be the direction in which robotic assembly moves. Unless camera 130 were precisely positioned to align its focal array with the X axis, axis $X_c$ will not align with the X axis. Nonetheless, any measurements made relative can be to the camera's axes, $X_c$ and $Y_c$, can be translated into the frame of reference for the handler if the camera is oriented relative to the X-axis.

The orientation process of step 410 is explained with reference to FIGS. 5A–5C. These figures illustrate an image formed by camera 130. In the illustrations, the images show a reference point on platform 120, such as reference point 316A.

Figures 5A, 5B, 5C:
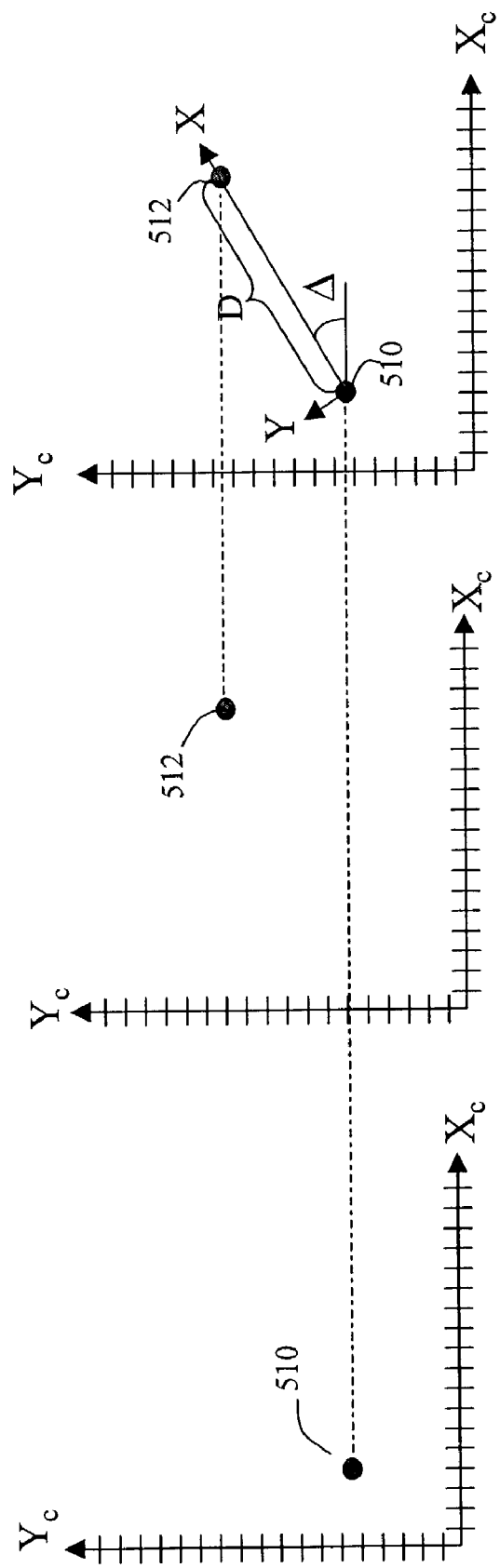
FIG. 5A-5C are sketches useful in understanding the mapping of coordinate systems.

FIG. 5A shows the image when platform 120 is moved to place reference point 316A into the field of view of camera 130. In this position, reference point 316A appears as spot 510 in the image.

Prior to making image FIG. 5B, robotic assembly 118 is moved in the X-direction. As a result, reference point 316A moves within the image created by camera 130 and forms spot 512.

The difference between spots 510 and 512 is some amount of motion in the X direction. FIG. 5C represents a composite image formed by controller 128 showing both spots 510 and 512. The line between them represents the X axis relative to the axes $X_c$ and $Y_c$. Using simple trigonometry, the angle Δ can be determined. The angle Δ can subsequently be used to translate positions of objects in images formed by camera 120 into X and Y coordinates.

It would also be possible, based on the composite image in FIG. 5C, for controller 128 to scale the image so that measurements made with camera 130 indicate actual distances. In particular, the distance D shown in FIG. 5C corresponds to the distance assembly 118 was moved in the X direction. However, commercially available cameras often include software that appropriately scales the images. In the preferred embodiment, a camera with available software to make these image corrections is employed. In the description that follows, it will be described that camera 130 is used to determine positions in the X-Y coordinate system. It should be appreciated that any such measurements are made by appropriately rotating and scaling the image formed by camera 130. These steps are not described for simplicity and can likewise be performed in software commercially available with cameras.

At step 414, controller 128 rotates platform 120 to make it parallel with the X-axis. This step is optional because it is not necessary that platform 120 be aligned with the X-axis. However, it simplifies the remainder of the alignment process and the control algorithm in general if platform 120 is aligned with the X-axis. If platform 120 is not aligned with the X-axis, the algorithm that moves platform 120 into alignment with test station 116 will need to account for any skew to calculate required motion of platform 120.

To compute rotation of platform 120 relative to the X-axis, platform 120 is moved so that reference points 316A and 316B are imaged. A line between the images of these two points should be parallel to the X-axis. If the line is not parallel to the X-axis, an angular deviation can be computed. Controller 128 can send the appropriate control signals to robotic assembly 118 to move it through the required angle to bring it into alignment with the X-axis.

Depending on the field of view of camera 130 and the length of platform 120, reference points 316A and 316B might not simultaneously fit in the field of view of camera 130. However, a composite image can be created by determining the position of reference point 316A. Then, platform 120 can be moved some distance x, to bring reference point 316B into the field of view. The position of the reference point 316B in the image could be determined and then shifted by the amount x to account for the motion of robotic assembly 118. This process of forming a composite image might be required at other steps in the operation of a handler incorporating the invention. However, the description of this process will not be repeated for simplicity.

Turning to step 418, the center of rotation of platform 120 is determined. Controller 128 may need to rotate platform to align devices under test located on platform 120 with test station 116. One of skill in the art will appreciate that it is desirable if the center of rotation of platform 120 is known when computing the commands to move robotic assembly 118.

One simple way of determining the center of rotation of platform 120 is to place a readily observable feature (320, FIG. 3) on the upper surface of platform 120. Platform 120 can then be moved under camera 130 and this feature can be imaged.

In this way, the center of rotation of platform 120 is determined relative to the X-Y plane. It should be appreciated that the center of rotation will move in the X direction as robotic assembly 118 moves in the X direction. Controller 128 is programmed to adjust its computation of the center of rotation based on the X position of robotic assembly 118. Likewise, the center of rotation will move with motion in the Y-direction and a similar correction is made for that motion. In the discussion that follows, this adjustment will not be explicitly mentioned, though it should be appreciated that such adjustments are made.

Returning to FIG. 4A, the next step is step 422. At this step, the location of sensor 134 is determined. The location of sensor 134 is determined by moving robotic assembly 118 until sensor 134 is in the field of view of camera 130. As described above, sensor 134 includes a fiber optic core 310 that emits light. Thus, in the preferred embodiment, the center of sensor 134 will appear as a bright spot in the image formed by camera 134 and will be easy to detect. The position of sensor 134 can be determined in the X-Y plane from the image formed by camera 130.

The position of sensor 134 determined by camera 130 represents the position of sensor 134 with robotic assembly 118 in a particular location. As robotic assembly 118 is moved, the position of sensor 134 will change. As described above, controller 128 tracks the position of robotic assembly 118. Controller 128 appropriately adjusts its computation of the X-Y position of sensor 134 based on movement of robotic assembly 118. This adjustment of the X-Y positions determined from images made by camera 130 based on movement of the other objects in test cell 100 will not be explicitly discussed for simplicity. However, it should be understood that controller 128 includes a software program that acts as a means for adjusting measurements of positions made with camera 130.

The next step in the process is to determine the location of the camera 130 in the coordinate system used as a reference. As mentioned above, camera 130 images the X-Y plane. Also, robot 118 moves in the X-Y plane. The position of robot 118 can be determined using sensor 124. But, it is necessary to be able to relate the positional measurements made with camera 130 to the positional measurements made with sensor 124. One way to do this is to pick a point in a reference coordinate systems as an origin and relate all of the measurements, whether made with camera 130 or with sensor 124, to that point. At step 426, a computation is made to determine the amount to offset measurements made with camera 130 to translate them into the reference coordinate system.

For example, the point representing the location of sensor 134 when robot 118 is at its leftmost limit of travel might be selected as the origin of the coordinate system. The position of camera 130 could be determined relative to this origin by first moving robot 118 until sensor 134 is visible in the camera. The position of sensor 134 relative to the original of the coordinate system of camera 130 would be recorded. This value would indicate the amount sensor 134 would have to move to get to the origin of the camera coordinate system. Then, robot 118 could be moved to its limit of travel, using sensor 124 to measure how far it moved. By combining these values, a value can be determined for the displacement between the origin of the camera coordinate system and the point chosen as the origin of the reference coordinate system.

One of skill in the art will appreciate that the actual origin of the reference coordinate system is not important to the invention so long as all necessary position measurement and motion commands can be correlated. Turning now to FIG. 4B, a second positional calibration sub-process is described. In FIG. 4B, the locations of the contact elements are determined. This step gives controller 128 information to align devices to be tested with the contact elements. Preferably, this step is repeated periodically as test cell 100 is operating. In a preferred embodiment, this calibration sub-process would be repeated between at an interval ranging from 10 to 60 minutes. Or, the process might be repeated during operation whenever the test cell is not otherwise needed to process parts, such as during "dead time" in the manufacturing process for semiconductor chips.

The calibration sub-process of FIG. 4B is preferably repeated during operation even though test site 116 is attached to the test cell 100. Thermal contraction or expansion could cause relative movement of the test site 116 as test cell 100 operates, particularly if test cell 100 tests parts at different temperatures.

In this sub-process, sensor 134 is used to locate the fiducials 132A and 132B. At step 440, robotic assembly 118 is moved to position sensor 134 in the vicinity of one of the fiducials 132A or 132B. This step is performed for each of the fiducials.

At step 444, robotic assembly 118 is moved to search for the edge of the fiducial. As described above, in the preferred embodiment, sensor 134 has a binary output that indicates an amount of light exceeding a threshold is being received by sensor 134. That threshold is set so that when a certain percentage of sensor 134 is directly below one of the fiducials, the amount of light reflected back to sensor 134 will exceed the threshold.

To locate an edge of the fiducial, controller 128 moves robotic assembly 118 so that sensor 134 has an output indicating that the threshold has not been exceeded. Controller 128 moves robotic assembly until the output of sensor 134 is "tripped"—meaning that the output changes state indicating that the threshold was crossed. The location of sensor 134 at the time the sensor is tripped is taken as an indication of the edge of the fiducial.

At step 448, the centers of the fiducials are determined. To determine the center of the fiducial, multiple points on the periphery of the fiducial are used. To determine additional points on the periphery of the fiducial, the same process is repeated. However, robotic assembly 118 is moved to a different starting position so that sensor 134 approaches the fiducial from a different direction.

Figure 6:
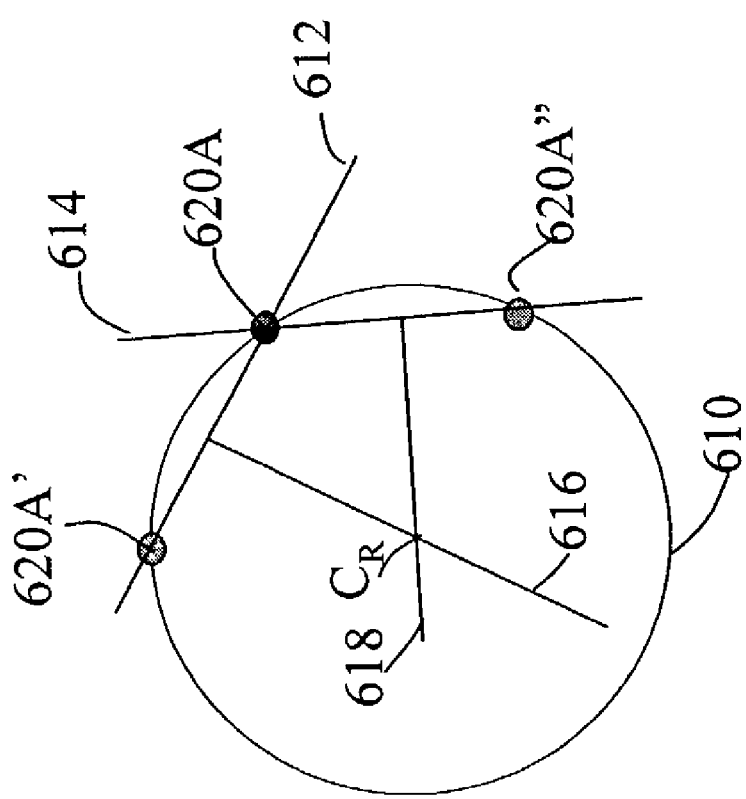
FIG. 6 is a sketch useful in understanding the determination of the center of a fiducial.

Once multiple points on the periphery of a fiducial are known, a geometric computation can be performed to locate the center of the fiducial, as indicated by step 448. In the case of a circular fiducial, a computation following the approach illustrated in FIG. 6 could be used. FIG. 6 depicts the three points 620A, 620A' and 620A" at which the threshold of the sensor was tripped. These three points represent three points around the perimeter of a circle 610. The center $C_R$ of circle 610 represents the center of the fiducial.

Once three points on the perimeter of a circle are known, simple trigonometry can be used to determine the center point. One such technique is demonstrated in FIG. 6. Lines 612 and 614 are drawn between pairs of points. These lines represent cords of the circle. Lines 616 and 618 are perpendicular to the midpoints of each of the cords. Lines 616 and 618 each pass through the center $C_R$ of circle 610. Therefore, the intersection of lines 616 and 618 defines the center $C_R$ of circle 610.

One advantage of using a circular fiducial is that the simple approach of FIG. 6 to determine its center can be used. A second advantage of using a circular fiducial is that the determination of the center of the fiducial is relatively insensitive to the threshold set for sensor 134. If the threshold is set low, the sensor will trigger when a small percentage of the sensor is below the fiducial. A lower threshold will cause the sensor to trigger when it is farther from the center of the fiducial. However, the same effect will occur when all points on the periphery are determined. The net effect of a lower threshold is that the determined points will fall along the perimeter of a larger circle. Nonetheless, the computation at step 448 will yield the same point as the center of the circle.

Turning now to step 452, the location of the contact elements is determined. Step 452 can be a simple mathematical calculation once the locations of the fiducials are determined. Test station 116 is manufactured such that the relationship between the fiducials and the contact elements is known in advance. This information is programmed into controller 128, which can simply offset the computed centers of the fiducials to determine the locations of the contact elements 220.

Step 452 could employ a more complicated calculation, if desired. For example, the spacing between the fiducials could be computed. This spacing could be compared to the nominal spacing between the fiducials to compute an expansion coefficient. This expansion coefficient would indicate the change in size of base member 210 due to expansion, such as might be caused by heating or cooling of test station 116. The predetermined spacing between the fiducials and the contact elements 220 might then be scaled by the coefficient to derive a more accurate position for the contact elements 220.

Regardless of the precise computation performed, at the end of sub-process in FIG. 4B, controller 128 has determined the location of the contact elements 220.

Turning now to FIG. 4C, a third sub-process is illustrated. This sub-process is preferably carried out each time a strip of devices 122 is placed on platform 120 for testing. At step 470, robotic assembly 118 is moved so that platform 120 is in the field of view of camera 130.

More preferably, identifiable features of the strip 122 are moved into the field of view. Identifiable features could include markings acting as fiducials added to the parts. Or, the identifiable features could include holes in the carrier strip or even specific leads of devices on the strip 122.

At step 474, images formed by camera 130 are analyzed to determine the location of the features. Standard feature recognition software may be used to detect features. The features selected should have a known relationship to the rest of the strip of semiconductor devices. Thus, once the location of the features is determined, the location of the entire strip of devices can be determined.

At step 478, the information on the location of the strip 122 is used to compute the appropriate motion commands to robotic assembly 118. Controller 128 sends commands to robotic assembly 118 to move strip 122 directly below the array of contactors 220. In the preferred embodiment, platform 120 moves in the X-Y plane and rotates about its center of rotation.

Once the strip 122 is aligned with the contactors 220, the devices are "plunged," as is standard in a handler. The devices are plunged by moving them in the Z-direction until they make contact with the contactors 220.

Once the devices have been plunged, they are tested at step 486. Testing is as is standard in test systems. Following testing, the devices complete the manufacturing process. For strip type devices, the good devices are separated from the strip and ultimately delivered to a customer. Devices might also be sorted based on test results, using such criteria as operating speed or maximum operating temperature.

In this way, devices may be easily aligned with the test station. Further, the alignment is achieved with a very simple sensor mounted on the robotic assembly.

Having described one embodiment, numerous alternative embodiments or variations might be made. For example, it was described that a sensor is mounted to platform 120. It is an advantage of the preferred embodiment that a relatively small and in-expensive component is used. However, a more complicated camera might be used instead.

Also, fiducials 132A and 132B were described as having been made from reflective inserts. They might alternatively be created from a surface layer of reflective material. However, it should be appreciated that fiducials need only be easily distinguished from their surroundings. They might, for example, be formed from optical fibers that emit light. If base 210 is made of a reflective material, fiducials can be formed from non-reflective material.

Also, it is not necessary that the fiducials be round. Any known shape might be used.

Moreover, it should be appreciated that sensor 134 is described as an optical sensor and the fiducials are described as having properties that make them readily distinguishable for their surroundings in an optical sense. Sensors might respond to other forms of energy besides light. For examples, sensors might operate on capactive or inductive principles. In these cases, the fiducials would have other properties making them readily distinguishable to the sensor. For example, if an inductive sensor is used, the fiducials could be made of a magnetic material.

Further, it is not necessary that two fiducials be used. If test station 116 is mounted with a known position relative to the X axis, a single fiducial would suffice to accurately locate the test station. Or, if a non-symmetrical fiducial were used, finding the boundaries of a single fiducial could provide enough information to determine the relative location and rotation of test station 116.

Further, it was described that the output of sensor 134 is a binary signal. It is not necessary that the output be binarized at the sensor. For example, an analog signal having a magnitude related to the incident light could be provided to controller 128, which could process the signal. Controller 128 could then determine when the amount of light incident on the sensor indicated that the sensor is under the fiducial.

Also, a single positional sensor 124 is pictured. However, it should be appreciated that the same functions might be performed by multiple sensor units distributed throughout the handler.

Further, X-Y stage 125 need not be a single assembly. The members that provide X and Y motion might be separated. For example, linear rails providing X-motion might be attached to the base of handling unit 110, while a mechanism to provide Y-motion might be mounted elsewhere, including on top of platform 120.

As another example, it was described that alignment steps were performed in sequence and in subgroups corresponding to FIGS. 4A–4C. It will be appreciated that the order in which the steps is performed is not critical to the invention. Moreover, the groups in which the steps are performed is often not critical.

In the above description, positions within the test cell 100 were defined in relation to an X-Y-Z Cartesian coordinate system. It should be appreciated that this coordinate system chosen to describe motion and position, but is not a limitation on the invention. It is well known in the art that translations can be made between various coordinate systems and that computations for position or motion are routinely performed in the coordinate system that is most convenient. As a specific example, it might be preferable to express X-Y positions relative to the center of platform 120. However, as robotic assembly 118 moved, the coordinate system would shift relative to stationary components of test cell 100, requiring an adjustment to the computed X-Y position of the stationary components.

As another variation, it was described that the preferred embodiment is in connection with semiconductor devices on a carrier strip. Devices in a tray or even single devices might similarly be tested using the invention.

In the illustrated embodiment, alignment was performed in three directions: X, Y and rotation. Alignment in three dimensions is adequate when platform 120 is parallel to test station 116 or if there is sufficient compliance in the contactors to compensate for any misalignment in the Z-direction. It is standard in the design of contactors and test stations to have compliance. However, if desired, the relative Z position of test strip 122 might also be measured and used to compute an additional adjustment. Alternatively, if mechanical features are used to ensure alignment in certain directions, alignment in three directions may not be required.

An alternative approach to detect the center of rotation of platform 120 at step 418 is to use features, such as 316A and 316B, on the upper surface of platform 120 that are offset form the center of rotation. Platform 120 might be rotated in one direction and an image of these points formed. Platform 120 might then be rotated in the opposite direction and a second image of these two points formed. A composite image could then be formed, reflecting the positions on points 316A and 316B in different rotational positions. The points 316A and 316B represent the end points of two cords of equal length of a circle. Using geometry, the center of this circle can be computed. The center of this circle is the center of rotation of platform 120.

What is claimed is:

1. A test cell comprising a test station and a robotic assembly for moving a device to the test station, the test cell comprising:

a camera having a field of view facing in direction of the robotic assembly;

at least one fiducial associated with the test station; and a sensor attached to the robotic assembly facing the fiducial, wherein the sensor comprises a light receptor configured to detect light reflected by the fiducial onto the light receptor, wherein the sensor is configured to substantially align to the fiducial when the light has an intensity that exceeds a threshold.

2. The test cell of claim 1, wherein the sensor comprises a light source and the fiducial comprises light reflective material.

3. The test cell of claim 2, wherein the sensor has a binary output, indicating that the intensity of the light is either below or above the threshold.

4. The test cell of claim 1, further comprising a position sensor associated with the robotic assembly, the position sensor having an output indicative of a position of the robotic assembly.

5. The test cell of claim 1, wherein the robotic assembly comprises a platform, the platform having an upper surface adapted to receive the device.

6. The test cell of claim 1, further comprising a controller, the controller comprising a program to position the robotic assembly toward the fiducial and to move the sensor to locate the fiducial.

7. The test cell of claim 6, wherein the controller comprises a program to move the sensor to detect a plurality of points on a periphery of the fiducial and to compute a center of the fiducial from the plurality of points.

8. The test cell of claim 1, wherein the at least one fiducial is circular.

9. The test cell of claim 1 used in a process of manufacturing semiconductor devices on carrier strips, comprising:

using the sensor to determine the location of the test station;

placing a semiconductor device on a carrier strip on the robotic assembly;

using the camera to determine a location of the semiconductor device;

using the location of the test station and the location of the semiconductor device to position the robotic assembly with the semiconductor device to align with the test station;

testing the semiconductor device; and further processing the semiconductor device based on results of testing the semiconductor device.

10. The test station of claim 1, further comprising at least two fiducials associated with the test station.

11. The test station of claim 10, wherein the test station further comprises a controller comprising a program that determines a location of each of the fiducials and determines a coefficient of expansion of the test station.

12. A test cell comprising:

a test station having a bottom surface that is substantially parallel to a first plane, the bottom surface holding a plurality of device contactors;

a robotic assembly having an upper surface substantially parallel to the first plane and facing the bottom surface, the upper surface holding a plurality of devices a camera having a field of view facing the first plane;

at least one fiducial associated with the test station; and a sensor attached to the robotic assembly facing the fiducial;

wherein the robotic assembly moves the upper surface of the robotic assembly towards the bottom surface of the test station such that the devices held by the upper surface contact the device contactors held by the bottom surface.

13. The test cell of claim 12, wherein at least one fiducial comprises visibly distinguishable features in a predetermined positional relationship to the plurality of contactors in the test station.

14. The test cell of claim 12, wherein the upper surface has a plurality of vacuum ports formed therein.

15. The test cell of claim 12, wherein the upper surface has a visually distinguishable feature marking its substantial center of rotation.

16. The test station of claim 12, wherein the sensor provides a binary output.

* * * * *